(12) United States Patent
Ahn

(10) Patent No.: US 7,880,656 B2
(45) Date of Patent: Feb. 1, 2011

(54) RF CHIP INCLUDING SHARED CONVERTER AND TRANSCEIVER INCLUDING THE RF CHIP

(75) Inventor: Hyung Ki Ahn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/238,707

(22) Filed: Sep. 26, 2008

(65) Prior Publication Data

US 2009/0096653 A1    Apr. 16, 2009

(30) Foreign Application Priority Data

Oct. 11, 2007    (KR) ...................... 10-2007-0102587

(51) Int. Cl.
*H03M 1/12*    (2006.01)
(52) U.S. Cl. ...................................... 341/155; 341/143
(58) Field of Classification Search ................. 341/155, 341/141; 370/321, 469; 375/295, 344
See application file for complete search history.

(56) References Cited

U.S. PATENT DOCUMENTS

| | | | | |
|---|---|---|---|---|
| 4,578,678 A | * | 3/1986 | Hurd ..................... | 342/357.12 |
| 5,715,281 A | * | 2/1998 | Bly et al. ................... | 375/344 |
| 7,139,332 B2 | * | 11/2006 | Yu et al. ..................... | 375/316 |
| 7,183,949 B2 | * | 2/2007 | Park ............................ | 341/61 |
| 7,227,910 B2 | * | 6/2007 | Lipka ......................... | 375/302 |
| 7,388,931 B1 | * | 6/2008 | Hsu et al. ................... | 375/316 |
| 2003/0142639 A1 | * | 7/2003 | Cheung et al. .............. | 370/321 |
| 2005/0025181 A1 | * | 2/2005 | Nazari ........................ | 370/469 |
| 2008/0317160 A1 | * | 12/2008 | Tzeng et al. ................ | 375/295 |
| 2009/0104884 A1 | * | 4/2009 | Lee et al. .................. | 455/277.1 |

FOREIGN PATENT DOCUMENTS

| | | |
|---|---|---|
| JP | 06205064 A | 7/1994 |
| JP | 2000236285 A | 8/2000 |
| JP | 2005303381 A | 10/2005 |

* cited by examiner

*Primary Examiner*—Peguy JeanPierre
(74) *Attorney, Agent, or Firm*—Volentine & Whitt, PLLC

(57) ABSTRACT

The invention generally relates to a radio frequency (RF) chip and/or a baseband chip for use in a wireless transmitter and/or receiver. Embodiments of the invention solve a problem caused by a mismatch in amplitude and/or phase between in-phase (I) and quadrature (Q) signals in such communication devices. According to an aspect of the invention, there is provided a communication device including: a baseband signal processing unit configured to output a plurality of analog baseband signals through a corresponding plurality of channels; and a radio frequency (RF) processing unit coupled to the plurality of channels, the RF processing unit configured to convert the plurality of analog baseband signals into a plurality of digital signals using a shared analog-to-digital converter (ADC), the RF processing unit further configured to generate an RF signal based on the plurality of digital signals.

15 Claims, 6 Drawing Sheets

RF CHIP INCLUDING SHARED CONVERTER AND TRANSCEIVER INCLUDING THE RF CHIP

CROSS-REFERENCE TO RELATED PATENT APPLICATION

This application claims the benefit of Korean Patent Application No. 10-2007-0102587, filed on Oct. 11, 2007, in the Korean Intellectual Property Office, the disclosure of which is incorporated herein in its entirety by reference.

SUMMARY OF THE INVENTION

The invention generally relates to a radio frequency (RF) chip and/or a baseband chip for use in a wireless transmitter and/or receiver. Embodiments of the invention solve a problem caused by a mismatch in amplitude and/or phase between in-phase (I) and quadrature (Q) signals in such communication devices.

According to an aspect of the invention, there is provided a communication device including: a baseband signal processing unit configured to output a plurality of analog baseband signals through a corresponding plurality of channels; and a radio frequency (RF) processing unit coupled to the plurality of channels, the RF processing unit configured to convert the plurality of analog baseband signals into a plurality of digital signals using a shared analog-to-digital converter (ADC), the RF processing unit further configured to generate an RF signal based on the plurality of digital signals.

According to another aspect of the invention, there is provided a radio frequency (RF) processing unit configured to receive an RF signal from an external device and output an analog I signal and an analog Q signal based on the RF signal; an analog interface coupled to an output of the RF processing unit, the analog interface having an I channel configured to carry the analog I signal and a Q channel configured to carry the analog Q signal; and a baseband signal processing unit coupled to the analog interface, the baseband signal processing unit having: a analog-to-digital converter (ADC) configured to convert the analog I signal and the analog Q signal to a digital I signal and a digital Q signal, respectively; and an interpolator coupled to an output of the ADC configured to perform an interpolation on one of the digital I signal and the digital Q signal.

According to another aspect of the invention, there is provided radio frequency (RF) chip including: a first switch unit configured to receive a first analog baseband signal through a first channel and a second analog baseband signal through a second channel, the first switch further configured to alternately output the first analog baseband signal and the second analog baseband signal in response to at least one clock signal; an analog-to-digital converter (ADC) connected to an output of the first switch unit, the ADC configured to convert the first analog baseband signal and the second analog baseband signal into a first digital signal and a second digital signal, respectively; and a second switch unit coupled to an output of the ADC, the second switch unit configured to selectively output the first digital signal and the second digital signal.

BRIEF DESCRIPTION OF THE DRAWINGS

The above and other features and advantages of the invention will become more apparent by describing in detail embodiments thereof with reference to the attached drawings in which.

DETAILED DESCRIPTION OF THE INVENTION

Figure 1:
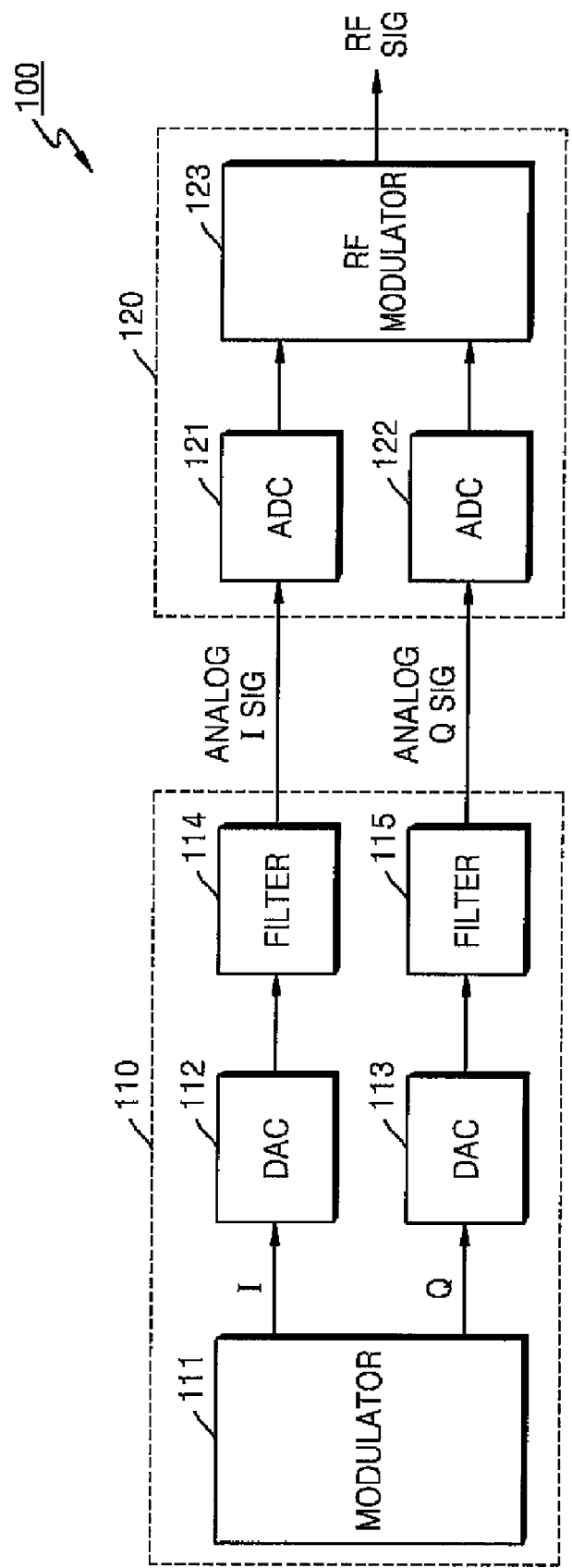
FIG. 1 is a block diagram of at least a portion of a transceiver.

Hereinafter, embodiments of the invention will be described in detail with reference to the accompanying drawings. It should be noted that like reference numerals refer to like elements illustrated in one or more of the drawings. In the following description of the invention, a detailed description of known functions and configurations will be omitted for conciseness and clarity.

FIG. 1 is a block diagram of at least a portion of a transceiver 100. As illustrated in FIG. 1, the transceiver 100 may include a baseband chip 110 for baseband signal processing and an RF chip 120 for high-frequency signal processing. The baseband chip 110 and the RF chip 120 communicate through an analog interface.

The baseband chip 110 includes a modulator 111, digital-to-analog converters (DACs) 112 and 113, and filters 114 and 115. The RF chip 120 includes analog-to-digital converters (ADCs) 121 and 122, and RF Modulator 123.

The modulator 111 modulates information such as voice, audio, and video in order to generate an in-phase (I) signal and a quadrature (Q) signal. With the development of digital signal processing technologies, the modulator 111 can be implemented as a digital circuit. The DACs 112 and 113 convert the digital I and Q signals into analog I and Q signals, respectively. The analog I and Q signals are then filtered by the filters 114 and 115, respectively, before being output to the RF chip 120. The filter(s) 114 and/or 115 may be or include, for example, a low-pass filter.

The analog I and Q signal (I SIG and Q SIG, respectively) are provided to the RF chip 120 through their corresponding channels. The ADCs 121 and 122 convert the input analog I and Q signals into digital signals. The digital I and Q signals are output to the RF modulator 123. The RF modulator 123 converts the digital I and Q signals into a high-frequency RF signal (RF SIG).

Figure 2:
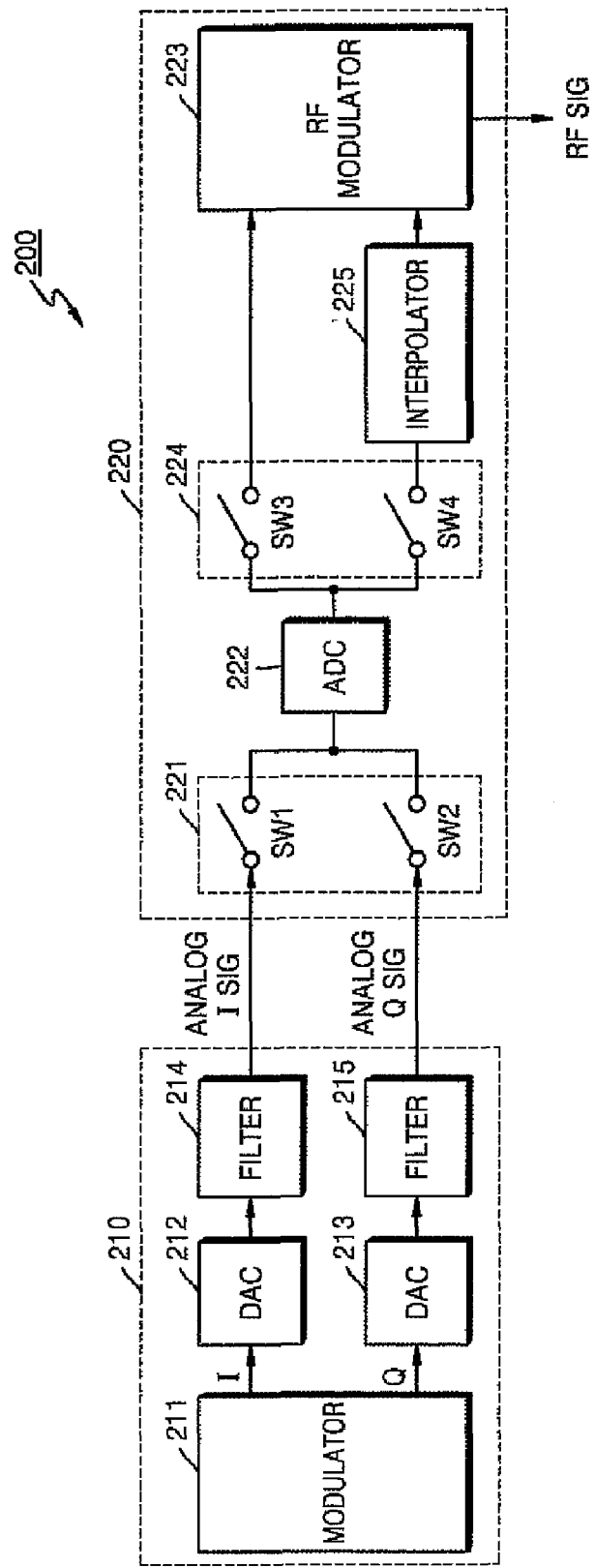
FIG. 2 is a block diagram of at least a portion of a transceiver according to an embodiment of the invention.

FIG. 2 is a block diagram of at least a portion of a transceiver 200 according to an embodiment of invention. In particular, FIG. 2 illustrates a transmitter that is configured to generate and transmit a radio frequency (RF) signal.

The transceiver 200 includes a baseband chip 210 for baseband signal processing and an RF chip 220 for high-frequency signal processing. Preferably, the baseband chip 210 and the RF chip 220 may communicate analog baseband signals I SIG and Q SIG through an analog interface. The RF chip 220 receives the analog baseband signals I SIG and Q SIG from the baseband chip 210 through a plurality of channels. For example, the in-phase signal I SIG is input through a first (I) channel and a quadrature signal Q SIG is input through a second (Q) channel.

The baseband chip 210 may include a modulator 211, one or more digital-to-analog converters (DACS) 212 and 213, and one or more filters, e.g., low-pass filters, 214 and 215. The modulator 211 modulates information such as voice, audio, and video in order to generate an I signal and a Q signal. With the development of digital signal processing technologies, the modulator 211 can be implemented as a digital circuit and in this case, the I signal and the Q signal generated by the modulator 211 are digital signals.

The DACs 212 and 213 convert the digital I signal and the digital Q signal into analog signals. For example, the DAC 212 is connected to an I signal output of the modulator 211 in order to convert the digital I signal into an analog signal and the DAC 213 is connected to a Q signal output of the modulator in order to convert the digital Q signal into an analog signal. The I signal and the Q signal are filtered by the filters 214 and 215, respectively, and the analog signals I SIG and Q SIG are output to the RF chip 220.

Although the RF chip 220 receives the analog signals I SIG and Q SIG on separate channels, a single (shared) ADC 222 converts both received signals into digital signals. By doing so, it is possible to reduce a mismatch between amplitudes and/or phases of the I channel and the Q channel that are caused by a mismatch between separate analog circuits.

When the ADC 222 converts the plurality of analog baseband signals into the digital signals, it performs the analog-to-digital conversion alternately on the analog baseband signals in a time-sharing manner. In other words, the ADC 222 alternately samples the analog signals I SIG and Q SIG.

In order to accurately demodulate the information such as voice, audio, and video by using the analog signal I SIG and the analog signal Q SIG, the RF chip 220 must sample the analog signal I SIG and the analog signal Q SIG at almost the same point in time as the analog-to-digital conversion. However, because the analog signal I SIG and the analog signal Q SIG are alternately sampled, a time delay may be generated in one of the I channel and the Q channel. In order to compensate for such time delay, the RF chip 220 may perform interpolation on the digital signal I or the digital signal Q.

Accordingly, the RF chip 220 may include a switch unit 221 for receiving the plurality of analog baseband signals, the ADC 222 connected to an output of the switch unit 221, and an RF modulator 223 for generating a high-frequency RF signal based on the analog-to-digital converted baseband signals. The RF chip 220 may further include a switch unit 224 between the ADC 222 and the RF modulator 223, and an interpolator 225 connected to an output of the switch unit 224.

The switch unit 221 may include switches SW1 and SW2. The switch SW1 is disposed to correspond to the I channel, and the switch SW2 is disposed to correspond to the Q channel. In response to a first clock signal, the switch SW1 outputs the analog signal I SIG to the ADC 222. In response to a second clock signal, the switch SW2 outputs analog signal Q SIG to the ADC 222. The first clock signal and the second clock signal may have a predetermined phase difference therebetween, and the switch SW1 and the switch SW2 are alternately switched.

The ADC 222 is commonly connected to outputs of the switch SW1 and the switch SW2. The ADC 222 converts the analog signals I SIG and Q SIG into digital signals I and Q, respectively.

The digital I and Q signals are input to the second switch unit 224. The second switch unit 224 is configured to separately output the digital I and Q baseband signals to the RF modulator 223. The second switch unit 224 may include switches SW3 and SW4. The switch SW3 switches the digital I signal output from the ADC 222, and the switch SW4 switches the digital Q signal output from the ADC 222. Preferably, the switch SW3 switches the digital I signal in response to the first clock signal, and the switch SW4 switches the digital Q signal in response to the second clock signal.

In the illustrated embodiment, an input of the interpolator 225 is connected to an output of the switch SW4. The interpolator 225 thus performs interpolation on the digital Q signal. The RF modulator 223 receives baseband signals corresponding to the digital I signal and the digital Q signal and converts them into a high-frequency RF signal RF SIG.

The invention is not limited to the example illustrated in FIG. 2. For instance, in an alternative embodiment, the interpolator 225 is connected to an output of switch SW3 rather than to switch SW4. In such an alternative embodiment, the interpolator 225 performs interpolation on the digital I signal.

An operation associated with the analog-to-digital conversion of the transceiver 200 illustrated in FIG. 2 will be described in detail with reference to FIG. 3.

Figure 3:
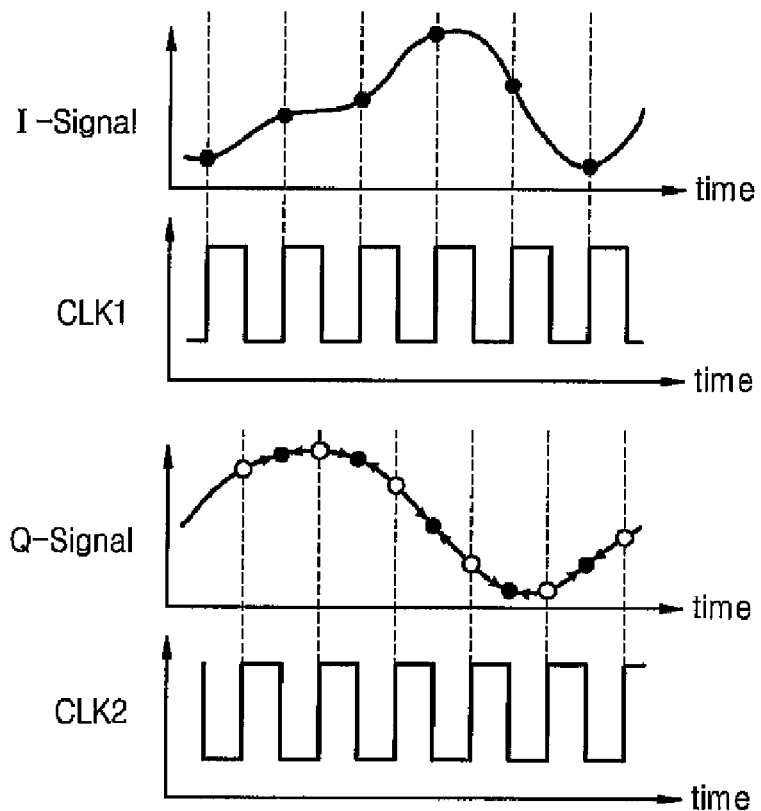
FIG. 3 is a timing diagram for sampling an in-phase (I) signal and a quadrature (Q) signal, and for interpolating the I signal and the Q signal at the radio frequency (RF) chip illustrated in FIG. 2.

FIG. 3 is a timing diagram for sampling the analog I signal and the analog Q signal, and for interpolating the analog I signal and the analog Q signal at the RF chip 220 illustrated in FIG. 2. In FIG. 3, an analog I-signal and an analog Q-signal provided to the RF chip 220 are illustrated. In addition, a first clock signal CLK1 and a second clock signal CLK2 for controlling a switching operation of the first switch unit 221 and/or the second switch unit 224 are illustrated. The sampling characteristics of the analog I-signal and the analog Q-signal are also illustrated in FIG. 3.

To alternately provide the analog I-signal and the analog Q-signal to the ADC 222, the first clock signal CLK1 and the second clock signal CLK2 have a predetermined phase difference therebetween. The switch SW1 of the first switch unit 221 is switched in response to a rising edge of the first clock signal CLK1. The switch SW2 of the second switch unit 221 is switched in response to a rising edge of the second clock signal CLK2. FIG. 3 thus illustrates that a predetermined time delay occurs between a sampling point of the analog I-signal and a sampling point of the analog Q-signal.

For example, when the first clock signal CLK1 and the second clock signal CLK2 have a phase difference corresponding to a half cycle therebetween, the analog Q signal is sampled at an intermediate point in time between sampling points of the analog I-signal as illustrated in FIG. 3. Thus, it is necessary to estimate a Q-signal value corresponding to a sampling point of the analog I-signal by using the sampled analog Q-signal. By performing interpolation on the analog-to-digital converted (or digital) Q-signal, the Q-signal value is estimated at a point in time indicated by arrows in FIG. 3. The interpolated digital Q-signal value is then output to the RF modulator 223.

The interpolation will be described in detail with reference to FIG. 4.

Figure 4:
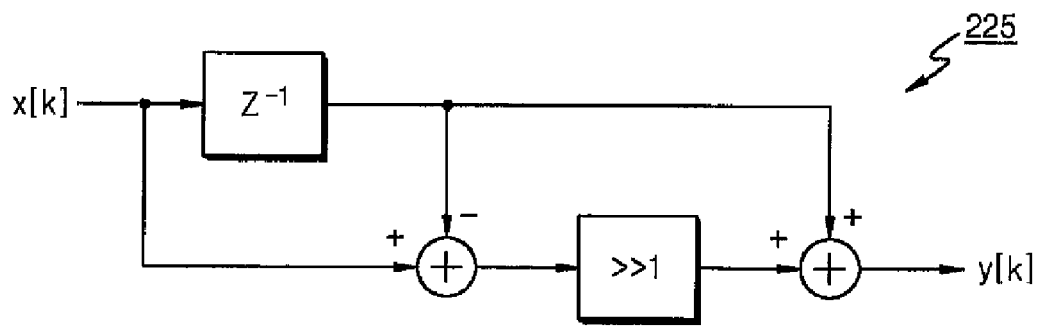
FIG. 4 is a circuit diagram of an example of the interpolator illustrated in FIG. 2.

FIG. 4 is a circuit diagram of an example of the interpolator 225 illustrated in FIG. 2. The interpolator 225 may be a digital filter which receives consecutive digital signals, e.g., digital Q signals, and outputs a single output. The interpolator 225 receives the digital Q signals and estimates a Q signal value at the same point in time as a sampling point of the I signal.

As illustrated in FIG. 4, the interpolator 225 may be a $2^{nd}$-order interpolator. If the interpolator 225 is implemented as a higher-order interpolator, a Q signal value can be more accurately estimated, although hardware complexity increases. Implementation of the high-order interpolator will not be described in detail.

The interpolator 225 illustrated in FIG. 4 receives a Q signal value x[k−1] at a time point (k−1) and a Q signal value x[k] at a time point k in order to calculate an average value (x[k−1]+0.5(x[k]−x[k−1])) of the Q signal values. The interpolator 225 outputs the average value as an output signal y[k].

Figure 5A:
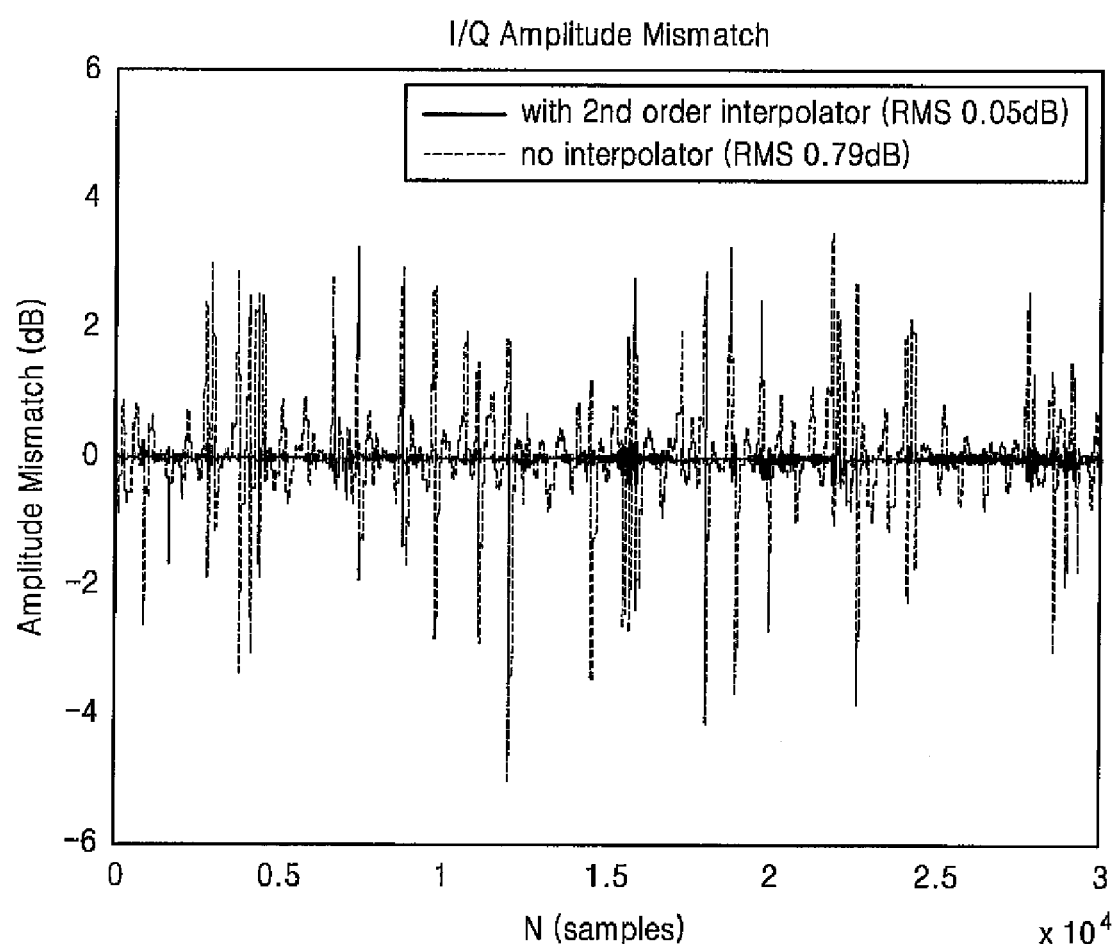
FIG. 5A is a graph of amplitude mismatch between an I signal and a Q signal according to the use and non-use of the interpolator illustrated in FIG. 2

FIG. 5A is a graph of amplitude mismatch between an I signal and a Q signal according to the use and non-use of the $2^{nd}$ order interpolator illustrated in FIG. 2. As can be seen from FIG. 5A, amplitude mismatch between the I channel and the Q channel when either channel undergoes $2^{nd}$-order interpolation is about 0.05 dB. By contrast, the amplitude mismatch between the I channel and the Q channel when neither channel undergoes $2^{nd}$-order interpolation is about 0.79 dB.

Figure 5B:
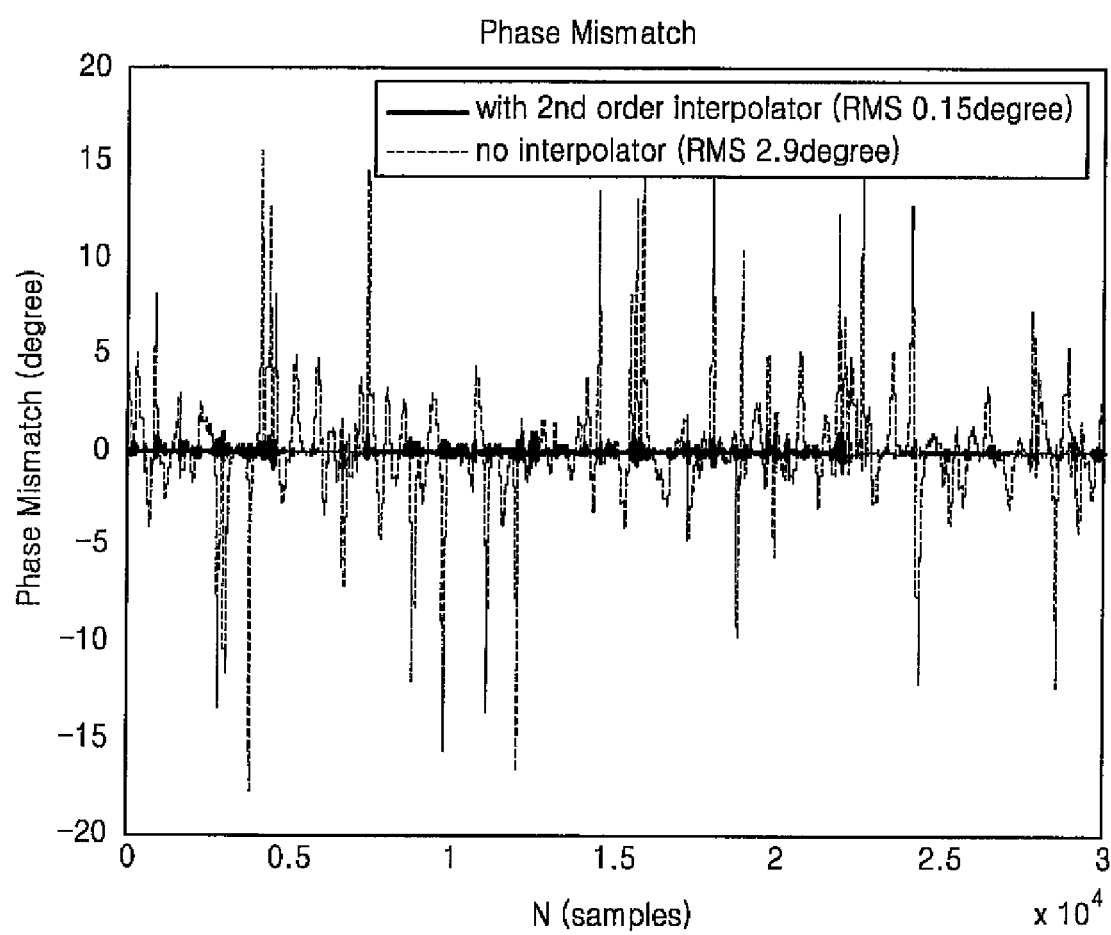
FIG. 5B is a graph of phase mismatch between an I signal and a Q signal according to the use and non-use of the interpolator illustrated in FIG. 2.

FIG. 5B is a graph of phase mismatch between an I signal and a Q signal according to the use and non-use of the $2^{nd}$ order interpolator illustrated in FIG. 2. As can be seen from FIG. 5B, a phase mismatch between the I channel and the Q channel when either channel undergoes $2^{nd}$-order interpolation is about 0.15 degree, By comparison, the phase mismatch between the I channel and the Q channel when neither undergoes $2^{nd}$-order interpolation is about 2.9 degrees.

Figure 6:
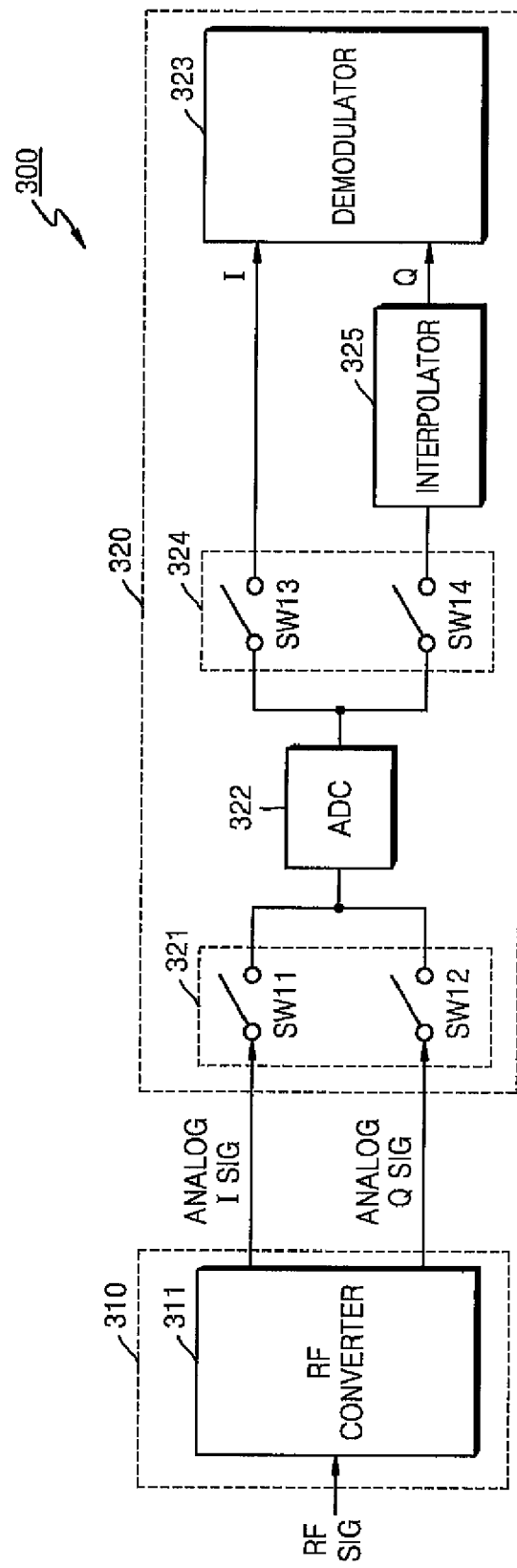
FIG. 6 is a block diagram of at least a portion of a transceiver according to another embodiment of the invention.

FIG. 6 is a block diagram of at least a portion of a transceiver 300 according to another embodiment of the invention. In particular, FIG. 6 illustrates a receiver for receiving an RF signal and converting the RF signal into baseband signals. Some of components illustrated in FIG. 6 function in the same manner as those illustrated in FIG. 2 and thus will not be described in detail.

Referring to FIG. 6, the transceiver 300 includes an RF chip 310 and a baseband chip 320. The RF chip 310 receives an RF signal from an external device and converts the RF signal into baseband signals. The baseband chip 320 receives the baseband signals, e.g., an I signal and a Q signal, from the RF chip 310 and performs signal processing on the received baseband signals. The RF chip 310 may include an RF converter 311 for converting a high-frequency RF signal into analog baseband signals.

The RF chip 310 and the baseband chip 320 communicate the analog baseband signals through an analog interface. The baseband chip 320 converts the analog signals into digital signals and performs signal processing on the digital signals, thereby reconstructing information such as voice, audio, and video.

The baseband chip 320 of the transceiver 300 converts the I signal and the Q signal into digital signals by using a shared ADC. To this end, the baseband chip 320 may include a first switch unit 321, an ADC 322, and a demodulator 323. The baseband chip 320 may further include a second switch unit 324 connected between the ADC 322 and the demodulator 323 and an interpolator 325 connected between the second switch unit 324 and the demodulator 323.

The first switch unit 321 may include a switch SW11 and a switch SW12. The switch SW11 switches an analog I signal provided from the RF chip 310 and the switch SW12 switches an analog Q signal provided from the RF chip 310. The switch SW11 may be switched in response to a first clock signal and the switch SW12 may be switched in response to a second clock signal that has a predetermined phase difference with the first clock signal. Thus, the ADC 322 alternately receives the analog I signal and the analog Q signal from the first switch unit 321.

Since the ADC 322 alternately converts the analog I signal and the analog Q signal into digital signals in a time-sharing manner, a time delay occurs between the analog-to-digital converted (or digital) I signal and Q signal. Thus, the interpolator 325 performs interpolation on either the digital I signal or the digital Q signal, thereby compensating for the time delay (in the embodiment illustrated in FIG. 6, the interpolator 325 performs interpolation on the Q signal). The interpolator 325 operates the same as the interpolator 225 (or its higher-order variants) described above.

The second switch unit 324 may include a switch SW13 and a switch SW14. The switch SW13 switches the digital I signal in order to provide the digital I signal to the demodulator 323. The switch SW14 switches the digital Q signal in order to provide the digital Q signal to the demodulator 323. The interpolator 325 is connected with an output of the switch SW14 in order to perform interpolation on the digital Q signal. In an alternative embodiment, the interpolator 325 may be connected to an output of the switch SW13 in order to perform interpolation on the digital I signal, instead Since only the single ADC 322 is used to convert multiple baseband signals, a problem that may be caused by mismatch between analog circuits can be avoided and the number of devices required for chip implementation can be reduced, thus leading to advantages in terms of chip area and power consumption. Moreover, by performing interpolation, a time delay between the digital I signal and the digital Q signal provided to the demodulator 323 can be minimized.

While the invention has been particularly shown and described with reference to embodiments thereof, it will be understood by one of ordinary skill in the art that various changes in form and detail may be made therein without departing from the spirit and scope of the present invention as defined by the following claims. For example, although the invention is described with respect to transceivers, the features described herein can also be used in a standalone transmitter or a standalone receiver.

What is claimed is:

1. A transmitter generating a radio frequency (RF) signal and comprising:
    a baseband signal processing chip configured to modulate information to generate an in-phase (I) signal and a quadrature (Q) signal, and respectively output the I signal via an I channel and the Q channel via a Q channel; and
    a radio frequency (RF) processing chip coupled to the I and Q channels via an analog signal, chip-to-chip interface, the RF processing unit configured to respectively convert the I signal and the Q signal into a digital I signal and a digital Q signal using a shared analog-to-digital converter (ADC), the RF processing unit further configured to generate the RF signal based on the digital I signal and the digital Q signal, the radio frequency (RF) processing unit comprising:
        a first switch unit including a first plurality of switches, an input for each one of the first plurality of switches being coupled to a corresponding one of the I and Q channels, an output for each one of the first plurality of switches being coupled to the shared ADC, wherein the first switch unit is configured to alternately transmit the I signal and Q signal to the shared ADC; and
        an interpolator configured to receive and interpolate only one of the digital I signal and the digital Q signal to respectively generate an interpolated digital I signal or an interpolated Q signal.

2. The communication device of claim 1, wherein the shared ADC alternately operates on the I signal and Q signal in a time-sharing manner to generate the digital I signal and digital Q signal.

3. The communication device of claim 2, wherein the interpolator performs interpolation on the digital Q signal to compensate for a time delay caused by the time-sharing manner.

4. The communication device of claim 1, wherein the RF processing unit further comprises:
an RF modulator coupled to the shared ADC and the interpolator and configured to convert either the digital I signal and the interpolated Q signal, or the digital Q signal and interpolated I signal into the RF signal.

5. The communication device of claim 4, wherein a first one of the first plurality of switches is configured to receive the I signal, a second one of the first plurality of switches is configured to receive the Q signal, the first one of the first plurality of switches is configured to output the I signal to the shared ADC in response to a first clock signal, the second one of the first plurality of switches is configured to output the Q signal to the shared ADC in response to a second clock signal, the first clock signal being out of phase with respect to the second clock signal.

6. The communication device of claim 4, wherein the RF processing unit further comprises:
a second switch unit comprising a second plurality of switches coupled to the shared ADC, wherein a first one of the second plurality of switches is configured to switch the digital I signal, a second one of the second plurality of switches configured to switch the digital Q signal.

7. The communication device of claim 6, wherein an input of the interpolator is connected to an output of the first one of the second plurality of switches in order to perform interpolation on the digital I signal.

8. The communication device of claim 6, wherein an input of the interpolator is connected to an output of the second one of the second plurality of switches in order to perform interpolation on the digital Q signal.

9. A communication device comprising:
a radio frequency (RF) processing unit configured to receive an RF signal from an external device and output an analog I signal and an analog Q signal based on the RF signal;
an analog interface coupled to an output of the RF processing unit, the analog interface having an I channel configured to carry the analog I signal and a Q channel configured to carry the analog Q signal; and
a baseband signal processing unit coupled to the analog interface, the baseband signal processing unit comprising:
an analog-to-digital converter (ADC) configured to alternately and respectively convert the analog I signal and the analog Q signal into a digital I signal and a digital Q signal in a time sharing manner;
a first switch unit coupled between the analog interface and the ADC, the first switch unit comprising; a first switch configured to selectively output the analog I signal to the ADC, and a second switch configured to selectively output the analog Q signal to the ADC; and
an interpolator coupled to an output of the ADC and configured to receive and interpolate only one of the digital Q signal and the digital I signal, and perform an interpolation on the received one of the digital I signal and the digital Q signal.

10. The communication device claim 9, wherein the baseband signal processing unit further comprises:
a second switch unit connected to an output of the ADC, the second switch unit comprising a third switch configured to selectively output the digital I signal, and a fourth switch configured to selectively output the digital Q signal.

11. The communication device of claim 10, wherein an input of the interpolator is connected to an output of the third switch to perform interpolation on the digital I signal.

12. The communication device of claim 10, wherein the interpolator is connected to an output of the fourth switch to perform interpolation on the digital Q signal.

13. A radio frequency (RF) chip comprising:
a first switch unit configured to receive a first analog baseband signal through a first channel and a second analog baseband signal through a second channel, the first switch further configured to alternately output the first analog baseband signal and the second analog baseband signal in response to at least one clock signal;
an analog-to-digital converter (ADC) connected to an output of the first switch unit, the ADC configured to convert the first analog baseband signal and the second analog baseband signal into a first digital signal and a second digital signal, respectively; and
a second switch unit coupled to an output of the ADC, the second switch unit configured to selectively output the first digital signal and the second digital signal;
an interpolator coupled to an output of the second switch unit and configured to receive and interpolate only the second digital signal to produce an interpolated second digital signal; and
an RF modulator coupled to receive the first digital signal from an output of the ADC and receive the interpolated second digital signal from an output of the interpolator, the RF modulator being configured to output a RF signal based on the first digital signal and the interpolated second digital signal.

14. The RF chip of claim 13 wherein the first analog baseband signal is an in-phase (I) signal and the second analog baseband signal is a quadrature (Q) signal.

15. The RF chip of claim 13 wherein the second analog baseband signal is an in-phase (I) signal and the first analog baseband signal is a quadrature (Q) signal.

* * * * *